(12) United States Patent
    Kanamori et al.

(10) Patent No.: US 10,896,728 B2
(45) Date of Patent: Jan. 19, 2021

(54) METHOD OF WRITING DATA IN NONVOLATILE MEMORY DEVICE, WITH DIVIDED SUBPAGES OR SUBBLOCKS, AND METHOD OF ERASING DATA IN NONVOLATILE MEMORY DEVICE WITH DIVIDED SUBPAGES OR SUBBLOCKS

(71) Applicant: Samsung Electronics Co., Ltd., Suwon-si (KR)

(72) Inventors: Kohji Kanamori, Seongnam-si (KR); Chang-Seok Kang, Seongnam-si (KR); Yong-Seok Kim, Suwon-si (KR); Kyung-Hwan Lee, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/243,281

(22) Filed: Jan. 9, 2019

(65) Prior Publication Data

US 2020/0020396 A1    Jan. 16, 2020

(30) Foreign Application Priority Data

Jul. 11, 2018    (KR) .......................... 10-2018-0080398

(51) Int. Cl.
    *G11C 13/00*    (2006.01)
    *G11C 7/12*    (2006.01)
    (Continued)

(52) U.S. Cl.
    CPC ............ *G11C 13/0069* (2013.01); *G11C 7/12* (2013.01); *G11C 11/5628* (2013.01);
    (Continued)

(58) Field of Classification Search
    CPC ............ G11C 11/5621; G11C 11/5628; G11C 11/5642; G11C 16/3454; G11C 16/3459;
    (Continued)

(56) References Cited

U.S. PATENT DOCUMENTS 6,377,507 B1 *   4/2002   Tsao .................... G11C 11/5621
                                                            365/185.14
6,469,955 B1 *  10/2002   Tsao .................... G11C 7/1042
                                                            365/185.17

(Continued)

FOREIGN PATENT DOCUMENTS

CN    106205710 B    12/2016
JP      5481564 B2    2/2014
(Continued)

OTHER PUBLICATIONS

Kurotsuchi, K., Sasago, Y., Yoshitake, H., Minemura, H., Anzai, Y., Fujisaki, Y., Takahama, T., Takahashi, T., Mine, T., Shima, A., Fujisaki, K., and Kobayashi, T., "2.8-GB/s-write and 670-MB/s-erase operations of a 3D vertical chain-cell-type phase-change-memory array", 2015 Symposium on VLSI Technology, Digest of Technical Papers, Jun. 16-18, 2015, T92-T93 (2 pages).

(Continued)

*Primary Examiner* — Vanthu T Nguyen
(74) *Attorney, Agent, or Firm* — Muir Patent Law, PLLC

(57) ABSTRACT

In a method of writing data in a nonvolatile memory device including a plurality of cell strings, each of the plurality of cell strings includes a plurality of memory cells disposed in a vertical direction. A program target page is divided into a plurality of subpages. The program target page is connected to one of a plurality of wordlines. Each of the plurality of subpages includes memory cells that are physically spaced apart from one another. A program operation is sequentially performed on the plurality of subpages. A program verification operation is performed on the program target page including the plurality of subpages at a time.

7 Claims, 15 Drawing Sheets

(51) Int. Cl.
*G11C 16/34* (2006.01)
*G11C 16/10* (2006.01)
*G11C 16/14* (2006.01)
*G11C 11/56* (2006.01)

(52) U.S. Cl.
CPC ...... *G11C 11/5642* (2013.01); *G11C 13/0026* (2013.01); *G11C 16/10* (2013.01); *G11C 16/14* (2013.01); *G11C 16/3436* (2013.01); *G11C 16/3454* (2013.01); *G11C 16/3459* (2013.01); *G11C 13/0064* (2013.01); *G11C 13/0097* (2013.01); *G11C 2013/0085* (2013.01)

(58) Field of Classification Search
CPC ............ G11C 13/0026; G11C 13/0064; G11C 13/0097
See application file for complete search history.

(56) References Cited

U.S. PATENT DOCUMENTS

| | | | |
|---|---|---|---|
| 7,400,537 B2 | 7/2008 | Hemink et al. | |
| 7,403,424 B2 | 7/2008 | Hemink et al. | |
| 7,403,428 B2 | 7/2008 | Higashitani | |
| 7,408,804 B2 | 8/2008 | Hemink et al. | |
| 7,430,138 B2 | 9/2008 | Higashitani | |
| 7,457,166 B2 | 11/2008 | Hemink et al. | |
| 7,486,564 B2 | 2/2009 | Hemink et al. | |
| 7,522,457 B2 | 4/2009 | Hemink et al. | |
| 7,606,100 B2 | 10/2009 | Hemink et al. | |
| 8,385,099 B2 | 2/2013 | Kaneko et al. | |
| 8,563,961 B2 * | 10/2013 | Sasago | H01L 27/2409 257/4 |
| 8,866,123 B2 | 10/2014 | Sasago et al. | |
| 9,013,917 B2 | 4/2015 | Kang | |
| 9,177,999 B2 | 11/2015 | Sasago et al. | |
| 9,183,940 B2 * | 11/2015 | Lee | G11C 16/0483 |
| 9,251,907 B2 * | 2/2016 | Goda | G11C 16/3418 |
| 9,318,199 B2 * | 4/2016 | Abraham | G11C 16/0483 |
| 9,391,268 B2 | 7/2016 | Sasago | |
| 9,478,284 B2 | 10/2016 | Sasago et al. | |
| 9,543,957 B2 | 1/2017 | Oda | |
| 9,905,756 B2 | 2/2018 | Sasago et al. | |
| 2008/0149913 A1 * | 6/2008 | Tanaka | H01L 27/2454 257/5 |
| 2013/0286747 A1 | 10/2013 | Kwak | |
| 2014/0063938 A1 | 3/2014 | Oh et al. | |
| 2014/0254270 A1 | 9/2014 | Maejima | |
| 2015/0262699 A1 | 9/2015 | Shirakawa | |
| 2015/0357045 A1 | 12/2015 | Moschiano et al. | |
| 2017/0092355 A1 | 3/2017 | Kurotsuchi et al. | |

FOREIGN PATENT DOCUMENTS

| | | |
|---|---|---|
| KR | 10-0892405 | 4/2009 |
| KR | 10-2013-0123904 | 11/2013 |

OTHER PUBLICATIONS

Kinoshita, M., Sasago, Y., Minemura, H., Anzai, Y., Tai, M., Fujisaki, Y., Kusaba, S., Morimoto, T., Takahama, T., Mine, T., Shima, A., Yonamoto, Y., and Kobayashi, T., "Scalable 3-D vertical chain-cell-type phase-change memory with 4F2 poly-Si diodes," 2012 Symposium on VLSI Technology Digest of Technical Papers, Jun. 12-14, 2012, pp. 35-36 (2 pages).

Sasago, Y., Kinoshita, M., Minemura, H., Anzai, Y., Tai, M., Kurotsuchi, K., Morita, S., Takahashi, T., Takahama, T., Morimoto, T., Mine, T., Shima, A., and Kobayashi, T., "Phase-change memory driven by poly-Si MOS transistor with low cost and high-programming gigabyte-per-second throughput," 2011 Symposium on VLSI Technology Digest of Technical Papers, Jun. 14-16, 2011, pp. 96-97 (2 pages).

Search Report and Written Opinion, dated Nov. 14, 2019, from the Intellectual Property Office of Singapore, in corresponding Application No. SG 10201900584T (12 pages).

* cited by examiner

METHOD OF WRITING DATA IN NONVOLATILE MEMORY DEVICE, WITH DIVIDED SUBPAGES OR SUBBLOCKS, AND METHOD OF ERASING DATA IN NONVOLATILE MEMORY DEVICE WITH DIVIDED SUBPAGES OR SUBBLOCKS

CROSS-REFERENCE TO RELATED APPLICATION

This application claims the benefit of priority under 35 U.S.C. § 119 to Korean Patent Application No. 10-2018-0080398, filed Jul. 11, 2018, in the Korean Intellectual Property Office (KIPO), the contents of which are herein incorporated by reference in their entirety.

BACKGROUND

1. Technical Field

Example embodiments relate generally to semiconductor memory devices, and more particularly to methods of writing data in nonvolatile memory devices, methods of erasing data in nonvolatile memory devices, and nonvolatile memory devices performing the methods.

2. Description of the Related Art

Semiconductor memory devices can generally be divided into two categories, depending upon whether or not they retain stored data when disconnected from a power supply. These categories include volatile memory devices, which lose stored data when disconnected from power, and nonvolatile memory devices, which retain stored data when disconnected from power. Volatile memory devices may perform read and write operations at a high speed, while contents stored therein may be lost at power-off. Nonvolatile memory devices may retain contents stored therein even at power-off, which means they may be used to store data that must be retained regardless of whether they are powered. Recently, semiconductor memory devices having memory cells that are stacked "vertically" (i.e., in three dimensions (3D)) have been researched to improve the capacity and integration density of the semiconductor memory devices.

SUMMARY

At least one example embodiment of the present disclosure provides a method of efficiently writing data in a nonvolatile memory device that includes memory cells stacked in three dimensions.

At least one example embodiment of the present disclosure provides a method of efficiently erasing data in a nonvolatile memory device that includes memory cells stacked in three dimensions.

At least one example embodiment of the present disclosure provides a nonvolatile memory device performing the method of writing data and the method of erasing data.

According to example embodiments, the disclosure is directed to a method of writing data in a nonvolatile memory device including a plurality of cell strings, each of the plurality of cell strings including a plurality of memory cells disposed in a vertical direction, the method comprising: dividing a program target page into a plurality of subpages, the program target page being connected to one of a plurality of wordlines, each of the plurality of subpages including memory cells that are physically spaced apart from one another; sequentially performing a program operation on the plurality of subpages; and performing a program verification operation on the program target page including performing the program verification operation on the plurality of subpages at the same time.

According to example embodiments, the disclosure is directed to a method of erasing data in a nonvolatile memory device including a plurality of cell strings, each of the plurality of cell strings including a plurality of memory cells disposed in a vertical direction, the method comprising: dividing an erase target block into a plurality of subblocks, the erase target block being connected to at least one of a plurality of wordlines, each of the plurality of subblocks including memory cells that are physically spaced apart from one another; sequentially performing an erase operation on the plurality of subblocks; and performing an erase verification operation on the erase target block including the plurality of subblocks at the same time.

According to example embodiments, the disclosure is directed to a nonvolatile memory device comprising: a memory cell array including a plurality of cell strings formed in a vertical direction, wherein each of the plurality of cell strings includes: a string selection transistor connected to a bitline and a string selection line; a plurality of memory cells disposed in the vertical direction between the string selection transistor and a common source line, the plurality of memory cells being connected to a plurality of wordlines, respectively; and a channel structure penetrating the string selection line and the plurality of wordlines that are stacked in the vertical direction, the channel structure including a resistive film, a channel layer surrounding the resistive film, and an insulation film surrounding the channel layer.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
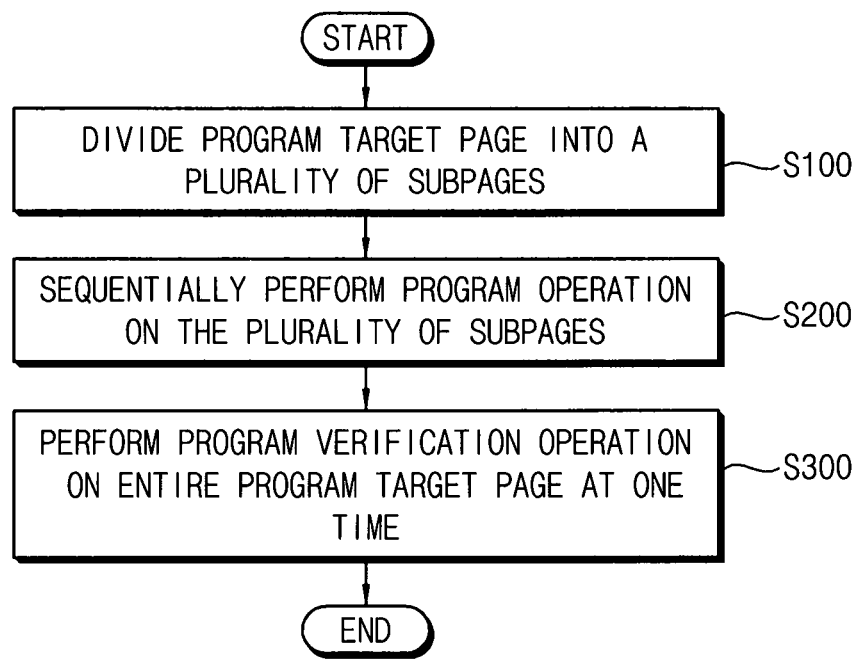
FIG. 1 is a flow chart illustrating a method of writing data in a nonvolatile memory device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a flow chart illustrating a method of writing data in a nonvolatile memory device according to example embodiments.

Referring to FIG. 1, a method of writing data according to example embodiments is performed by a nonvolatile memory device including a plurality of cell strings, and each of the plurality of cell strings includes a plurality of memory cells disposed in a vertical direction. For example, each cell string includes a plurality of memory cells that are stacked in a direction intersecting (e.g., substantially perpendicular to) a substrate. Configurations of the nonvolatile memory device will be described in detail with reference to FIGS. 2 through 6.

In the method of writing data in the nonvolatile memory device according to example embodiments, a program target page is divided into a plurality of subpages (step S100). A plurality of memory cells included in the nonvolatile memory device may be connected to a plurality of wordlines, and memory cells connected to one wordline may form a single page. In the nonvolatile memory device according to example embodiments, a data writing operation or a data programming operation may be performed by units of a subpage.

The program target page may be one of a plurality of pages that are connected to the plurality of wordlines, and may be connected to one of the plurality of wordlines. Each of the plurality of subpages may include two or more memory cells that are not physically adjacent to one another (e.g., that are physically spaced apart from one another with one or more other memory cells therebetween). The subpage may be referred to as a program target memory cell group or chunk. Configurations of the program target page and the plurality of subpages will be described in detail with reference to FIG. 8.

A program operation is sequentially performed on the plurality of subpages one-by-one (step S200). For example, the program operation may be performed sequentially by individual units of a subpage.

A program verification operation is performed one program target page at a time, where the program target page includes the plurality of subpages (step S300). The program verification operation may be performed on the entire program target page at substantially the same time. For example, the program verification operation may be performed by units of a page.

Figure 2:
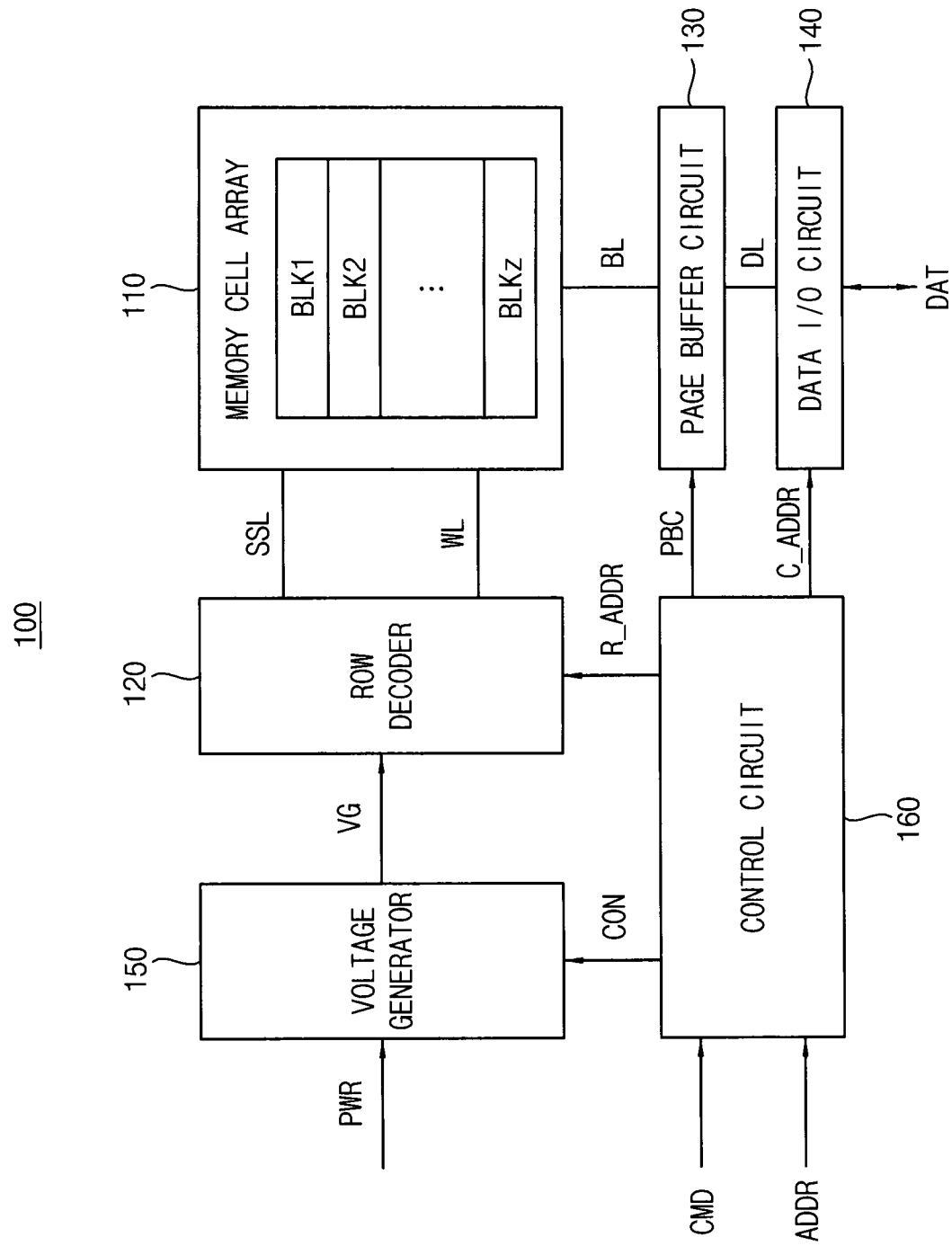
FIG. 2 is a block diagram illustrating a nonvolatile memory device according to example embodiments.

FIG. 2 is a block diagram illustrating a nonvolatile memory device according to example embodiments.

Referring to FIG. 2, a nonvolatile memory device 100 includes a memory cell array 110, a row decoder 120, a page buffer circuit 130, a data input/output (I/O) circuit 140, a voltage generator 150, and a control circuit 160.

The memory cell array 110 is connected to the row decoder 120 via a plurality of string selection lines SSL and a plurality of wordlines WL. The memory cell array 110 is further connected to the page buffer circuit 130 via a plurality of bitlines BL. The memory cell array 110 may include a plurality of memory cells (e.g., a plurality of nonvolatile memory cells) that are connected to the plurality of wordlines WL and the plurality of bitlines BL. The memory cell array 110 may be divided into a plurality of memory blocks BLK1, BLK2, . . . , BLKz, each of which includes memory cells.

In some example embodiments, as will be described with reference to FIGS. 3 through 6, the memory cell array 110 may be a three-dimensional memory cell array, which is formed on a substrate in a three-dimensional structure (or a vertical structure). In this example, the memory cell array 110 may include a plurality of cell strings (e.g., a plurality of vertical memory cell strings) that are vertically oriented such that, for each cell string, at least one memory cell is located over another memory cell.

The control circuit 160 receives a command CMD and an address ADDR from a memory controller (e.g., a memory controller 600 in FIG. 12), and the control circuit 160 controls erasure, programming, and read operations of the nonvolatile memory device 100 based on the received command CMD and the received address ADDR. An erasure operation may include performing a sequence of erase loops, and a programming operation may include performing a sequence of program loops. Each program loop may include a program operation and a program verification operation. The program operation may be an operation that causes data to be written or stored in the nonvolatile memory device 100. Each erase loop may include an erase operation and an erase verification operation. The erase operation may be an operation that causes data to be erased from the nonvolatile memory device 100.

As described with reference to FIG. 1, the program operation may be performed by units of a subpage, and the program verification operation may be performed by units of a page. Similarly, as will be described with reference to FIG. 9, the erase operation may be performed by units of a subblock, and the erase verification operation may be performed by units of a block.

For example, based on the command CMD, the control circuit 160 may generate control signals CON, which are used for controlling the voltage generator 150, and may generate control signals PBC for controlling the page buffer circuit 130. Based on the address ADDR, the control circuit 160 may generate a row address R_ADDR and a column address C_ADDR. The control circuit 160 may provide the row address R_ADDR to the row decoder 120 and may provide the column address C_ADDR to the data I/O circuit 140.

Figure 9:
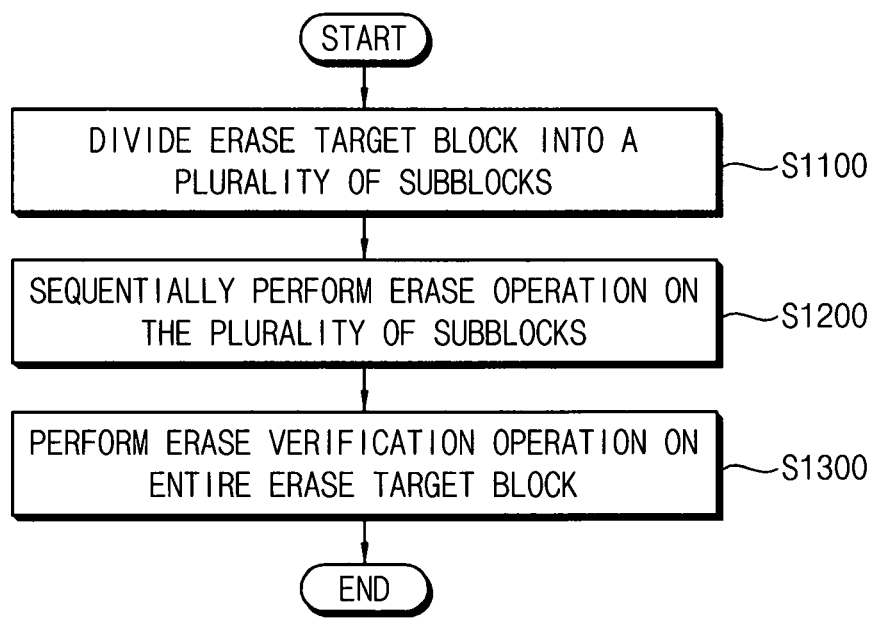
FIG. 9 is a flow chart illustrating a method of erasing data in a nonvolatile memory device according to example embodiments.

In addition, based on the command CMD and the address ADDR, the control circuit 160 controls the row decoder 120, the page buffer circuit 130, the data I/O circuit 140, and the voltage generator 150 to perform the method of writing data according to example embodiments (e.g., the method of FIG. 1) and/or a method of erasing data according to example embodiments (e.g., a method of FIG. 9).

The row decoder 120 may be connected to the memory cell array 110 via the plurality of string selection lines SSL and the plurality of wordlines WL.

For example, based on the row address R_ADDR, in the data erase/write/read operations, the row decoder 120 may determine at least one of the plurality of wordlines WL as a selected wordline, and may determine the rest or remainder of the plurality of wordlines WL other than the selected wordline as unselected wordlines.

In addition, based on the row address R_ADDR, in the data erase/write/read operations, the row decoder 120 may determine at least one of the plurality of string selection lines SSL as a selected string selection line, and may determine the rest or remainder of the plurality of string selection lines SSL other than the selected string selection line as unselected string selection lines.

The voltage generator 150 may generate wordline voltages VG and/or bitline voltages that are required for an operation of the nonvolatile memory device 100 based on a power PWR received by the voltage generator 150 and the received control signals CON. The wordline voltages VG may be applied to the plurality of wordlines WL via the row decoder 120, and the bitline voltages may be applied to the plurality of bitlines BL.

For example, during the program operation, the voltage generator 150 may apply an off voltage to the selected wordline by units of a subpage, may apply an on voltage to the unselected wordlines, and may apply a program voltage to bitlines of cell strings connected to the selected wordline. In addition, during the program verification operation, the voltage generator 150 may apply the off voltage to the selected wordline by units of a page, may apply the on voltage to the unselected wordlines, and may apply a program verification voltage to the bitlines of the cell strings connected to the selected wordline.

For example, during the erase operation, the voltage generator 150 may apply the off voltage to the selected wordline by units of a subblock, may apply the on voltage to the unselected wordlines, and may apply an erase voltage to the bitlines of the cell strings connected to the selected wordline. In addition, during the erase verification operation, the voltage generator 150 may apply the off voltage to the selected wordline by units of a block, may apply the on voltage to the unselected wordlines, and may apply an erase verification voltage to the bitlines of the cell strings connected to the selected wordline.

In addition, during the read operation, the voltage generator 150 may apply a read voltage to the selected wordline and may apply a read pass voltage to the unselected wordlines.

The page buffer circuit 130 may be connected to the memory cell array 110 via the plurality of bitlines BL. The page buffer circuit 130 may include a plurality of page buffers. In some example embodiments, each page buffer may be connected to one bitline. In other example embodiments, each page buffer may be connected to two or more bitlines.

The page buffer circuit 130 may store data DAT to be programmed into the memory cell array 110 or may read data DAT sensed from the memory cell array 110. For example, the page buffer circuit 130 may operate as a write driver or a sensing amplifier according to an operation mode of the nonvolatile memory device 100.

The data I/O circuit 140 may be connected to the page buffer circuit 130 via data lines DL. The data I/O circuit 140 may provide the data DAT from an outside of the nonvolatile memory device 100 (e.g., from the memory controller 600 in FIG. 12) to the memory cell array 110 via the page buffer circuit 130 or may provide the data DAT from the memory cell array 110 to the outside of the nonvolatile memory device 100, based on the column address C_ADDR. The data I/O circuit 140 may send/receive the data DAT to/from the memory cell array 110 via the page buffer circuit 130 via the data lines DL.

Figure 3:
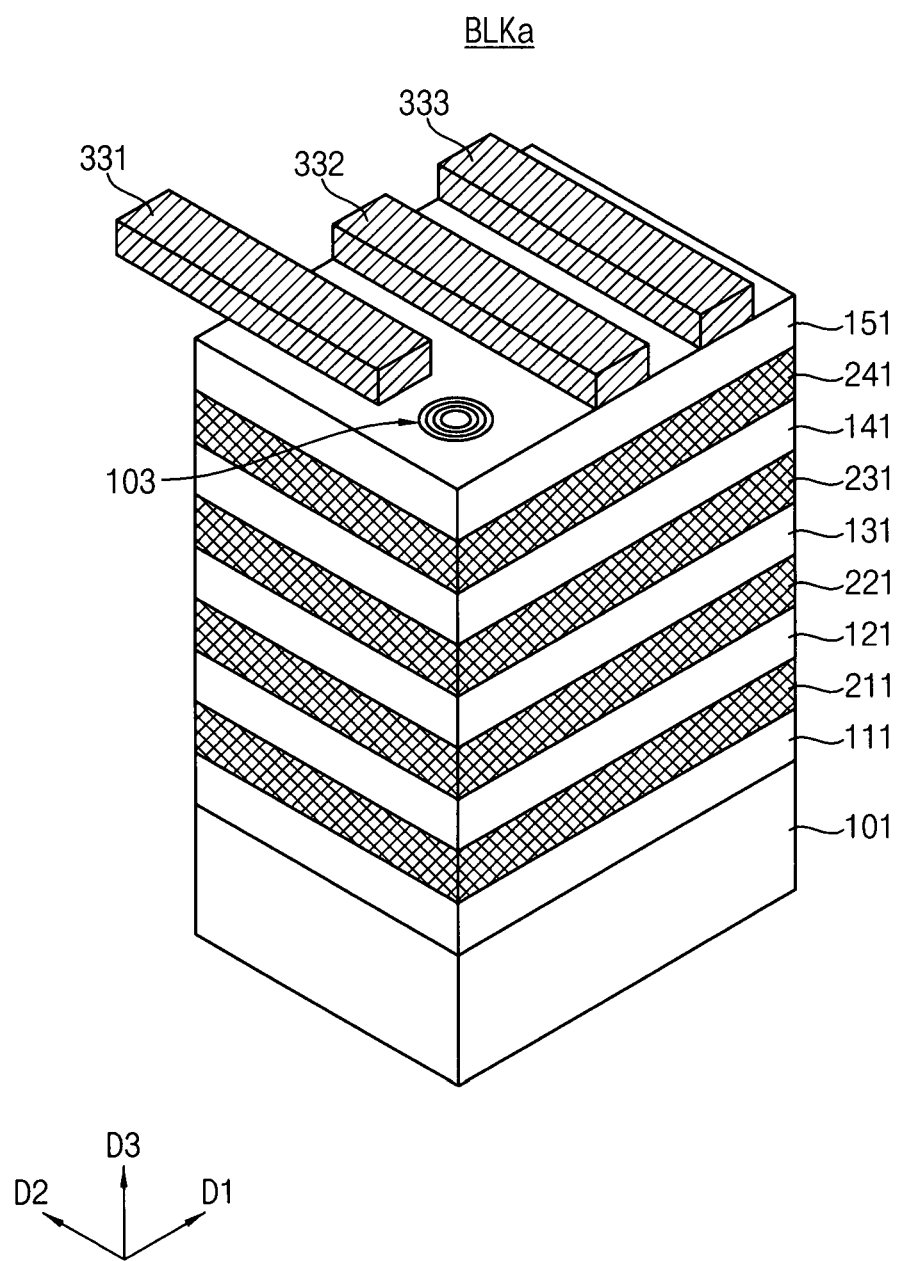
FIG. 3 is a perspective view illustrating an example of a memory block that is included in a memory cell array of the nonvolatile memory device of FIG. 2.
Figure 4A:
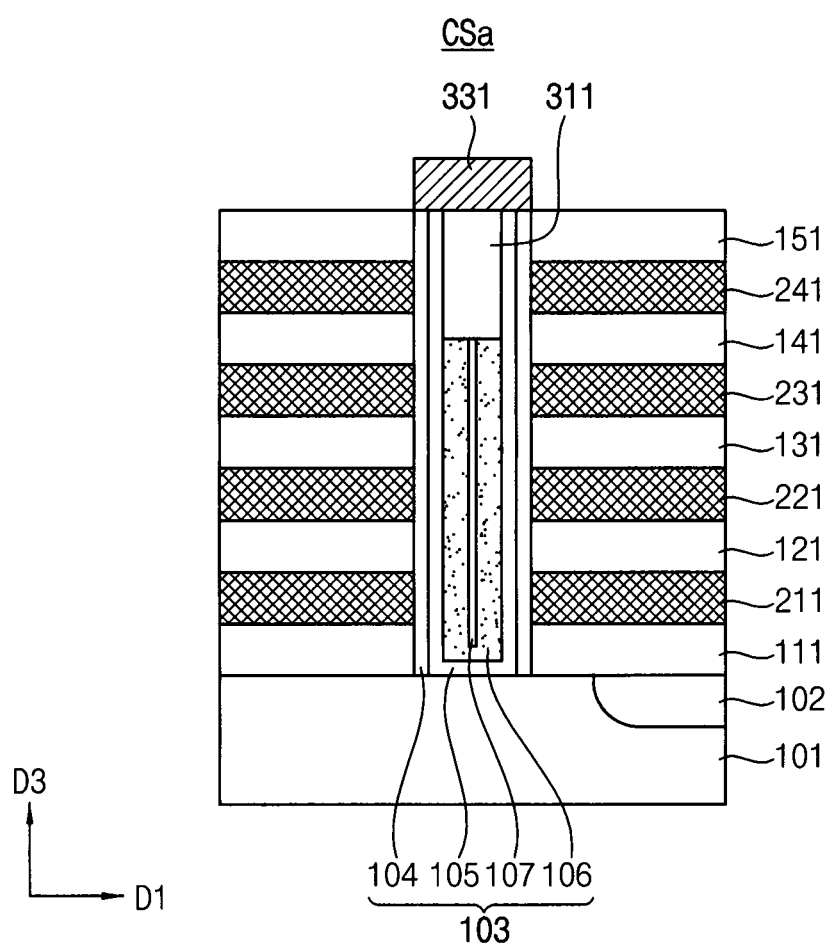
FIG. 4A is a cross-sectional view of an example of a cell string that is included in the memory block of FIG. 3.
Figure 4B:
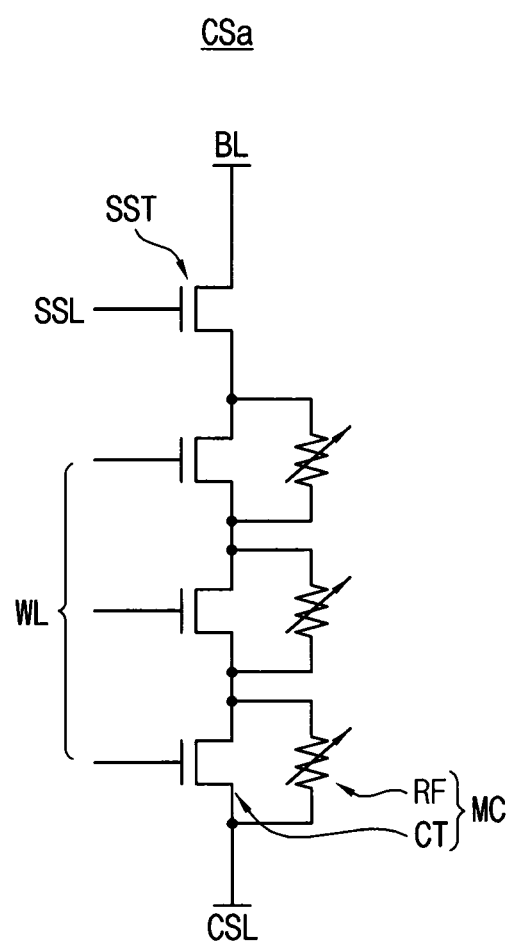
FIG. 4B is a circuit diagram illustrating an equivalent circuit of the cell string described with reference to FIG. 4A.

FIG. 3 is a perspective view illustrating an example of a memory block that is included in a memory cell array of the nonvolatile memory device of FIG. 2. FIG. 4A is a cross-sectional view of an example of a cell string that is included in the memory block of FIG. 3. FIG. 4B is a circuit diagram illustrating an equivalent circuit of the cell string described with reference to FIG. 4A.

Referring to FIGS. 3, 4A, and 4B, a memory block BLKa includes a plurality of cell strings which are formed on a substrate in a three-dimensional structure (or a vertical structure). The memory block BLKa and/or a cell string CSa includes structures extending along first, second, and third directions D1, D2 and D3.

A substrate 101 is provided. For example, the substrate 101 may have a well of a first type (e.g., a first conductivity type) therein. For example, the substrate 101 may have a p-well formed by implanting a group 3 element such as boron (B). In particular, the substrate 101 may have a pocket p-well provided within an n-well. In one embodiment, the substrate 101 has a p-type well (or a p-type pocket well). However, the conductive type of the substrate 101 is not limited to p-type.

At least one doping region 102 extending lengthwise along the second direction D2 is provided in/on the substrate 101. The at least one doping region 102 may have a second type (e.g., a second conductivity type) different from the first type of the substrate 101. In one embodiment, the at least one doping region 102 may have an n-type. However, the conductive type of the at least one doping region 102 is not limited to n-type.

A plurality of stacked insulation materials 111, 121, 131, 141, and 151 and a plurality of stacked first conductive materials 211, 221, 231, and 241 are sequentially and alternately provided along the third direction D3 on the substrate 101 in/on an area in which the at least one doping region 102 is formed. For example, the plurality of insulation materials 111, 121, 131, 141, and 151 may be layers provided along the third direction D3, being spaced by a specific distance. For example, one first conductive material (e.g., the first conductive material 211) may be provided between two adjacent insulation materials (e.g., the insulation materials 111 and 121). The plurality of insulation materials 111, 121, 131, 141 and 151 may include an insulation material such as, for example, a silicon oxide. The plurality of first conductive materials 211, 221, 231 and 241 may be layers that include a conductive material such as, for example, a polysilicon.

A plurality of pillars 103 penetrating the plurality of insulation materials 111, 121, 131, 141, and 151 and the plurality of first conductive materials 211, 221, 231, and 241 along the third direction D3 are sequentially disposed along the first and second directions D1 and D2 on the substrate 101 in/on the area in which the at least one doping region 102 is formed. For example, each of the plurality of pillars 103 may penetrate at least a portion of the plurality of insulation materials 111, 121, 131, 141, and 151 and the plurality of first conductive materials 211, 221, 231, and 241 to contact the substrate 101. Each pillar 103 may correspond to the cell string CSa.

FIG. 3 illustrates an example where each of the plurality of insulation materials 111, 121, 131, 141, and 151 and the plurality of first conductive materials 211, 221, 231, and 241 is provided as one layer, however, the inventive concepts are not limited to these illustrated embodiments. For example, at least a portion of the plurality of insulation materials 111, 121, 131, 141, and 151 and/or the plurality of first conductive materials 211, 221, 231, and 241 may be removed to separate each cell string and/or each memory block from other cell strings and/or other memory blocks.

In some example embodiments, each pillar 103 may include a plurality of materials. For example, each pillar 103 may include a surface layer 104 which is the outermost layer, a first inner layer 105 which is located inside the surface layer 104, a second inner layer 106 which is located inside the first inner layer 105, and a third inner layer 107 which is located inside the second inner layer 106. The pillar 103 may also be described as channel structure 103, the surface layer 104 may also be described as insulation film 104, the first inner layer 105 may be described as channel layer 105, the second inner layer 106 may be described as resistive layer 106, and the third inner layer 107 may be described as insulation material 107.

The surface layer 104 of each pillar 103 may include an insulation material. The surface layer 104 may extend lengthwise from a top surface of the substrate 102 to an uppermost one of the plurality of insulation materials 111, 121, 131, 141, and 151 and the plurality of first conductive materials 211, 221, 231, and 241, forming a barrier between the first inner layer 105 and the plurality of insulation materials 111, 121, 131, 141, and 151 and the plurality of first conductive materials 211, 221, 231, and 241. The surface layer 104 may form a gate insulation layer or insulation film between a gate electrode and a channel of a cell transistor and a string selection transistor.

The first inner layer 105 of each pillar 103 may include a silicon material having a first conductivity type. The first inner layer 105 may have a bottom portion that extends horizontally across the top surface of the substrate 102 and side portions that extend from the top surface of the substrate 102 to an uppermost one of the plurality of insulation materials 111, 121, 131, 141, and 151 and the plurality of first conductive materials 211, 221, 231, and 241. The first inner layer 105 may form a channel or a channel layer of a cell string (e.g., the channel of the cell transistor and the string selection transistor). For example, the first inner layer 105 may include a silicon material having the same conductivity type as the substrate 101. In one embodiment, the first inner layer 105 may include p-type silicon. However, the first inner layer 105 is not limited to the p-type silicon.

Uppermost horizontal surfaces of the surface layer 104 and the first inner layer 105 may be coplanar with one another and with a top surface of the uppermost one of the plurality of insulation materials 111, 121, 131, 141, and 151 and the plurality of first conductive materials 211, 221, 231, and 241. As used herein, the terms "same," "equal," "planar," or "coplanar," when referring to orientation, layout, location, shapes, sizes, amounts, or other measures does not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

The second inner layer 106 of each pillar 103 may include a resistive material. The second inner layer 106 may form a variable resistor of the cell string (e.g., a resistor element having a variable resistance and connected in parallel with the cell transistor). For example, the second inner layer 106 may include at least one of various resistive materials in which resistance states are changed by applying an electric signal (e.g., a voltage or a current) thereto. The second inner layer 106 may be reversibly phase-changed between the crystal phase and the amorphous phase upon application of operating voltage or current. For example, the second inner layer 106 may have an amorphous state having a relatively high resistance during a reset operation (e.g., the program operation) and may have a crystal state having a relatively low resistance during a set operation (e.g., the erase operation).

In some example embodiments, the second inner layer 106 may include a phase change material that changes its crystalline state depending on an amount of a current. The phase change material may include various materials such as GaSb, InSb, InSe, Sb2Te3, and GeTe in which two elements are combined, GeSbTe, GaSeTe, InSbTe, SnSb2Te4, and InSbGe in which three elements are combined, and AgInSbTe, (GeSn)SbTe, GeSb(SeTe), and Te81Ge15Sb2S2 in which four elements are combined. In other example embodiments, the second inner layer 106 may include a perovskite compound, a transition metal oxide, a magnetic material, a ferromagnetic material, or an anti-ferromagnetic material, instead of the phase change material. However, the materials included in the second inner layer 106 are not limited thereto.

The third inner layer 107 of each pillar 103 may include an insulation material. For example, the third inner layer 107 may include an insulation material such as a silicon oxide. In some examples, the third inner layer 107 may include an air gap. The third inner layer 107 may extend vertically from a top surface of the bottom portion of the second inner layer 106 to a top surface of the second inner layer 106. For example, a top surface of the third inner layer 107 may be coplanar with a top surface of the second inner layer 106.

For example, each pillar 103 may include the third inner layer 107 or an insulation material which is the innermost layer, the second inner layer 106 or a resistive film which surrounds the third inner layer 107 and includes a resistive material, the first inner layer 105 or a channel layer which surrounds the second inner layer 106 and includes a silicon material, and the surface layer 104 or an insulation film which surrounds the first inner layer 105 and includes an insulation material. Each pillar 103 may be referred to as a channel structure. A plurality of second conductive materials 331, 332, and 333 extending lengthwise along the second direction D2 are provided on the substrate 101 on which are formed the plurality of insulation materials 111, 121, 131, 141, and 151, the plurality of first conductive materials 211, 221, 231, and 241 and the plurality of pillars 103. The plurality of second conductive materials 331, 332, and 333 may be disposed along the first direction D1, being spaced by a specific distance. In some embodiments, the plurality of second conductive materials 331, 332, and 333 may be disposed such that each one extends across a plurality of cell strings. For example, the plurality of second conductive materials 331, 332, and 333 may include metal materials. For example, the plurality of second conductive materials 331, 332, and 333 may include conductive materials such as a polysilicon.

An insulation material 311 is provided between the second conductive material 331 and the pillar 103. A bottom surface of the second conductive material 331 may be in contact with top surfaces of the surface layer 104 and the first inner layer 105. The term "contact," as used herein, refers to a connection contact (i.e., touching) unless the context indicates otherwise. Although not illustrated in FIG. 4A, a drain region or a contact plug may be further provided to electrically connect the second conductive material 331 with the pillar 103.

In an example of FIGS. 3, 4A and 4B, the doping region 102 may be used to form a common source line CSL. The first conductive materials 211, 221, 231, and 241 may be used to form a string selection line SSL and wordlines WL. For example, the insulation film (e.g., surface layer 104), the channel layer (e.g., first inner layer 105), and the uppermost first conductive material 241, which is spaced apart from and at a higher vertical level than the second inner layer 106 (the resistive film), may be used to form the string selection line SSL and a string selection transistor SST. The insulation film (e.g., surface layer 104), the channel layer (e.g., first inner layer 105), the resistive film (e.g., second inner layer 106), and the first conductive materials 211, 221, and 231 other than the uppermost first conductive material 241 may be used to form the wordlines WL, cell transistors CT, and variable resistors RF. One cell transistor CT and one variable resistor RF may form one memory cell MC. The second conductive materials 331, 332, and 333 may be used to form the bitlines BL.

In addition, in the example of FIGS. 3, 4A, and 4B, the number of layers of the first conductive materials 211, 221, 231, and 241 and the number of the string selection line SSL and the wordlines WL may be changed variously according to process and control techniques. For example, the number of layers of the first conductive materials 211, 221, 231, and 241 and the number of the string selection line SSL and the wordlines WL may be greater or fewer than that illustrated in FIGS. 3, 4A, and 4B.

In a structure illustrated in FIGS. 4A and 4B, one cell string CSa may include the string selection transistor SST and the memory cells MC, and may further include the channel structure (e.g., pillar 103) for implementing the string selection transistor SST and the memory cells MC. The string selection transistor SST may be connected to the bitline BL and the string selection line SSL. The memory cells MC may be disposed in the vertical direction (e.g., the third direction D3) between the string selection transistor SST and the common source line CSL, and may be connected to the wordlines WL, respectively. The channel structure (e.g., pillar 103) may penetrate the string selection line SSL and the wordlines WL that are stacked in the vertical direction, may include the resistive film (e.g., second inner layer 106), the channel layer (e.g., first inner layer 105), and the insulation film (e.g., surface layer 104), and may further include the insulation material (e.g., third inner layer 107).

Figure 5A:
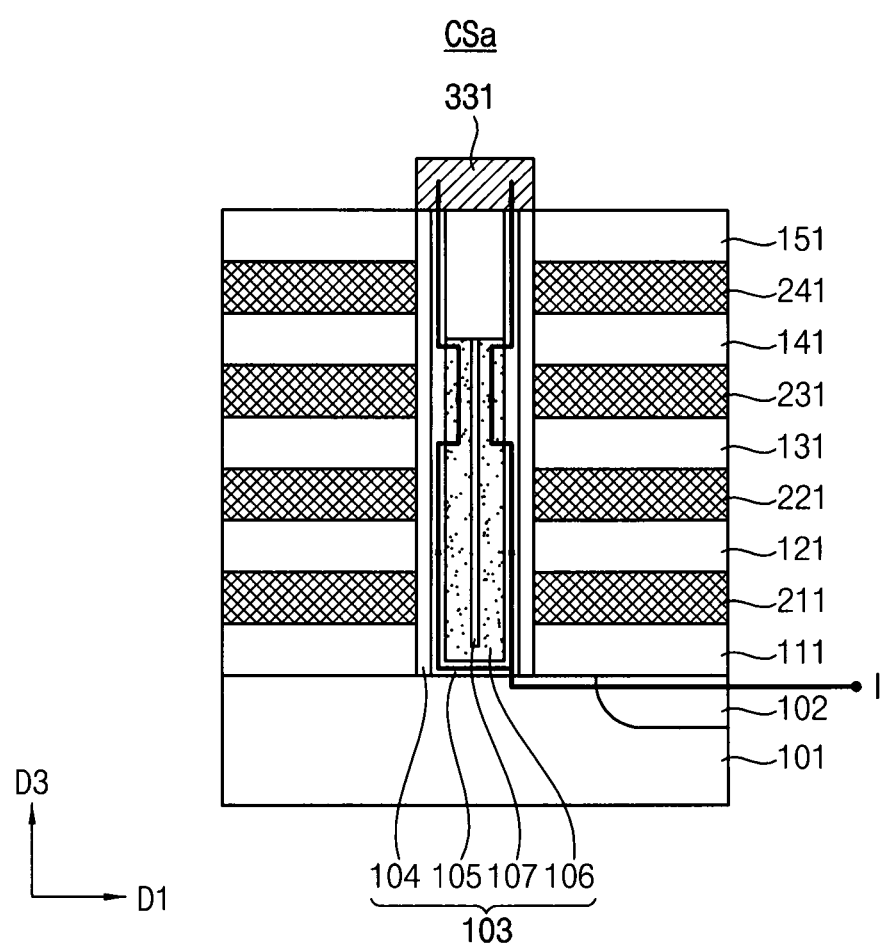
FIGS. 5A and 5B are diagrams for describing an operation of the cell string of FIGS. 4A and 4B.
Figure 5B:
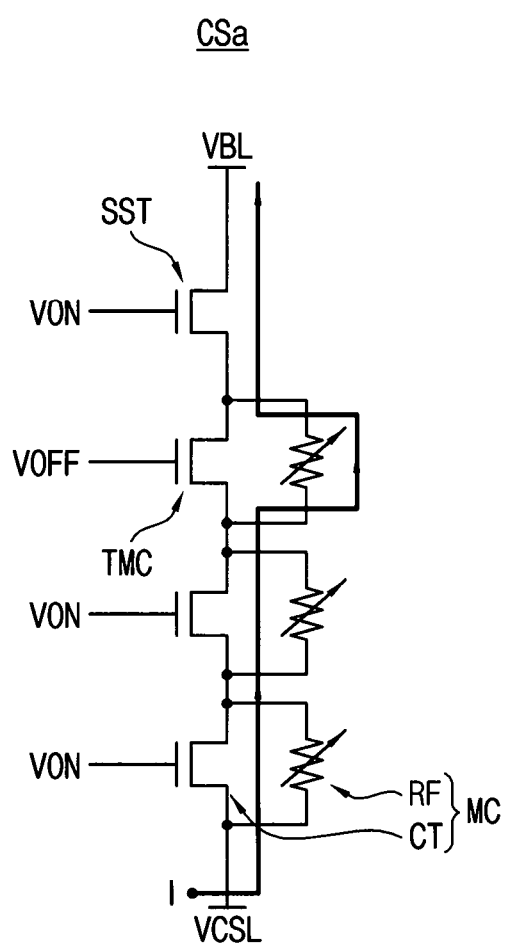

FIGS. 5A and 5B are diagrams for describing an operation of the cell string of FIGS. 4A and 4B.

Referring to FIGS. 5A and 5B, among the memory cells MC included in the cell string CSa, a memory cell directly below the string selection transistor SST may be selected as a target memory cell TMC, and the program operation or the erase operation may be performed on the target memory cell TMC. An off voltage VOFF may be applied to a wordline connected to the target memory cell TMC, an on voltage VON may be applied to the string selection line SSL and the rest or remainder of wordlines, a bitline voltage VBL may be applied to the bitline BL, and a common source line voltage VCSL may be applied to the common source line CSL. For example, the program voltage may be applied to the bitline BL during the program operation, and the erase voltage may be applied to the bitline BL during the erase operation.

As illustrated in FIGS. 5A and 5B, a current I may flow through transistors to which the on voltage VON is applied and may flow through a variable resistor connected in parallel with a transistor to which the off voltage VOFF is applied. For example, the current I may flow through the resistive film 106 in the target memory cell TMC and may flow through the channel layer 105 in the string selection transistor SST and the rest or remainder of memory cells. In this case, a resistance of the resistive film 106 in the target memory cell TMC may be changed based on a level of the program voltage or the erase voltage applied to the bitline BL. Although FIGS. 5A and 5B illustrate an example where the current I flows from the common source line CSL to the bitline BL, a direction of the current I may be changed based on levels of the bitline voltage VBL and the common source line voltage VCSL.

As described above, when the program operation or the erase operation is to be performed in the nonvolatile memory device according to example embodiments, the off voltage VOFF may be applied to the wordline connected to the target memory cell TMC, and the program voltage or the erase voltage may be applied to the bitline BL. For example, in the nonvolatile memory device according to example embodiments, a channel boosting effect may not be used for the program operation or the erase operation. Thus, while ground selection lines and ground selection transistors may be used in these example embodiments, unlike a typical NAND flash memory device, ground selection lines and ground selection transistors are not required in the nonvolatile memory device according to example embodiments.

Figure 6:
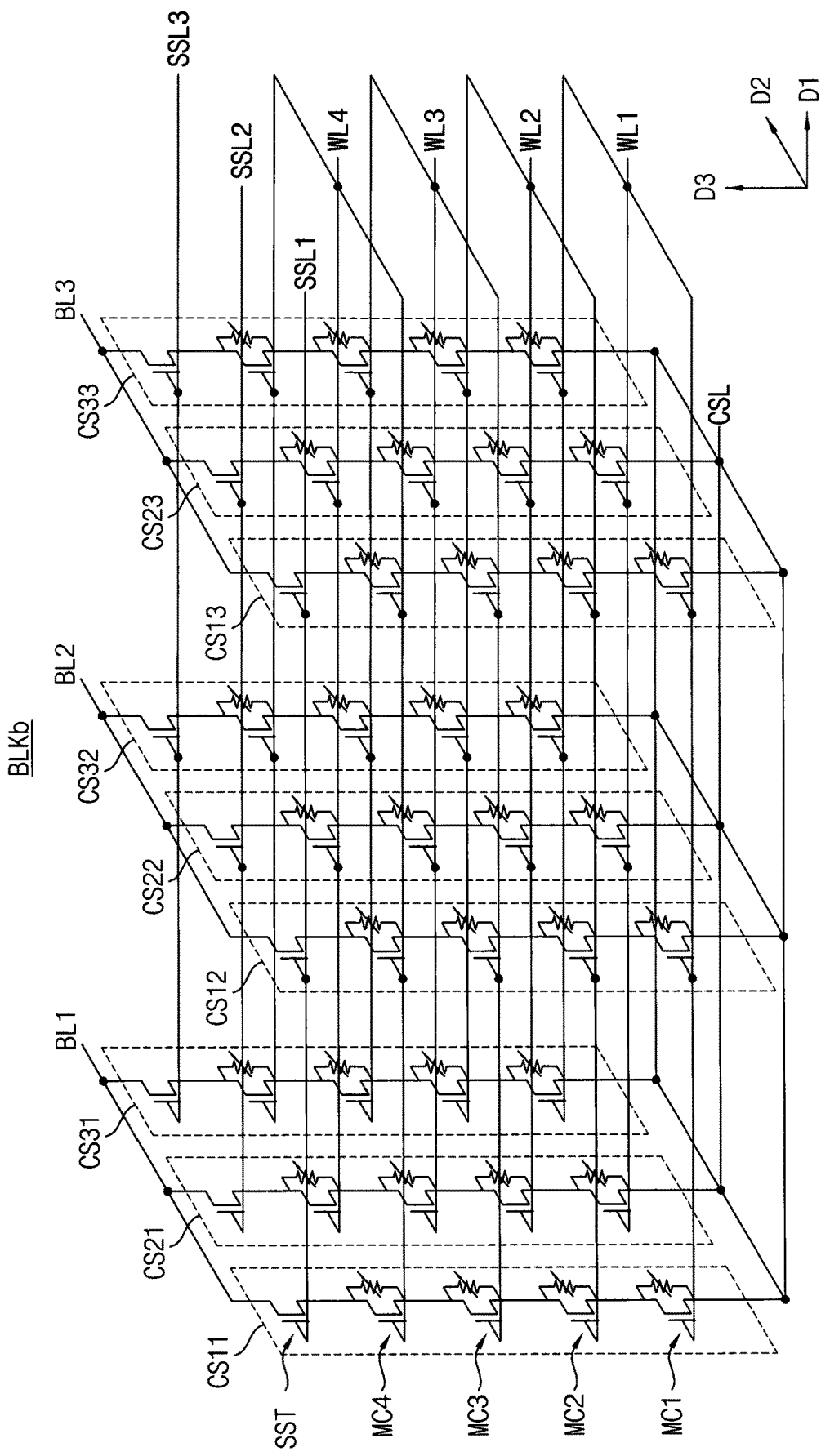
FIG. 6 is a circuit diagram illustrating an equivalent circuit of the memory block described with reference to FIG. 3.

FIG. 6 is a circuit diagram illustrating an equivalent circuit of the memory block described with reference to FIG. 3.

A memory block BLKb of FIG. 6 may be formed on a substrate in a three-dimensional structure (or a vertical structure). For example, a plurality of cell strings included in the memory block BLKb may be formed in a direction perpendicular to the substrate.

Referring to FIG. 6, the memory block BLKb may include a plurality of cell strings CS11, CS12, CS13, CS21, CS22, CS23, CS31, CS32, and CS33 connected between bitlines BL1, BL2 and BL3 and a common source line CSL. Each of the plurality of cell strings CS11, CS12, CS13, CS21, CS22, CS23, CS31, CS32, and CS33 may include a string selection transistor SST and a plurality of memory cells MC1, MC2, MC3 and MC4. For example, the bitlines BL1, BL2 and BL3 may correspond to the second conductive materials 331, 332, and 333 in FIG. 3, and the common source line CSL may be formed by the doping region 102 in FIG. 3.

The string selection transistors SST may be connected to corresponding string selection lines SSL1, SSL2, and SSL3, respectively. The plurality of memory cells MC1, MC2, MC3, and MC4 may be connected to corresponding wordlines WL1, WL2, WL3, and WL4, respectively. The string selection transistors SST may be connected to corresponding bitlines BL1, BL2, and BL3, respectively, and the lowermost memory cells MC1 may be connected to the common source line CSL. In the example of FIG. 6, some of the string selection transistors may be connected to the same bitline to connect corresponding cell strings to the same bitline upon appropriate selection via selection voltages applied to the appropriate string selection lines.

The cell strings connected in common to one bitline may form one column, and the cell strings connected to one string selection line may form one row. For example, the cell strings CS11, CS21, and CS31 connected to the bitline BL1 may correspond to a first column, and the cell strings CS11, CS12, and CS13 connected to the string selection line SSL1 may form a first row.

Wordlines (e.g., WL1) having the same height may be commonly connected, and the string selection lines SSL1, SSL2, and SSL3 may be separated. Memory cells located at the same semiconductor layer may share a wordline. Cell strings in the same row may share a string selection line. The common source line CSL may be connected in common to all of the cell strings.

In FIG. 6, the memory block BLKb is illustrated as being connected to four wordlines WL1, WL2, WL3, and WL4, three bitlines BL1, BL2, and BL3, and three string selection lines SSL1, SSL2, and SSL3 with one stage, and each cell string is illustrated to include four memory cells MC1, MC2, MC3, and MC4. However, the inventive concepts are not limited to these illustrated embodiments. In some example embodiments, each memory block in the memory cell array 110 may be connected to any number of wordlines, bitlines, and string selection lines, and each cell string may include any number of memory cells.

A three-dimensional vertical array structure may include vertical cell strings that are vertically oriented such that at least one memory cell is located over another memory cell. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and U.S. Pat. App. Pub. No. 2011/0233648.

Figure 7:
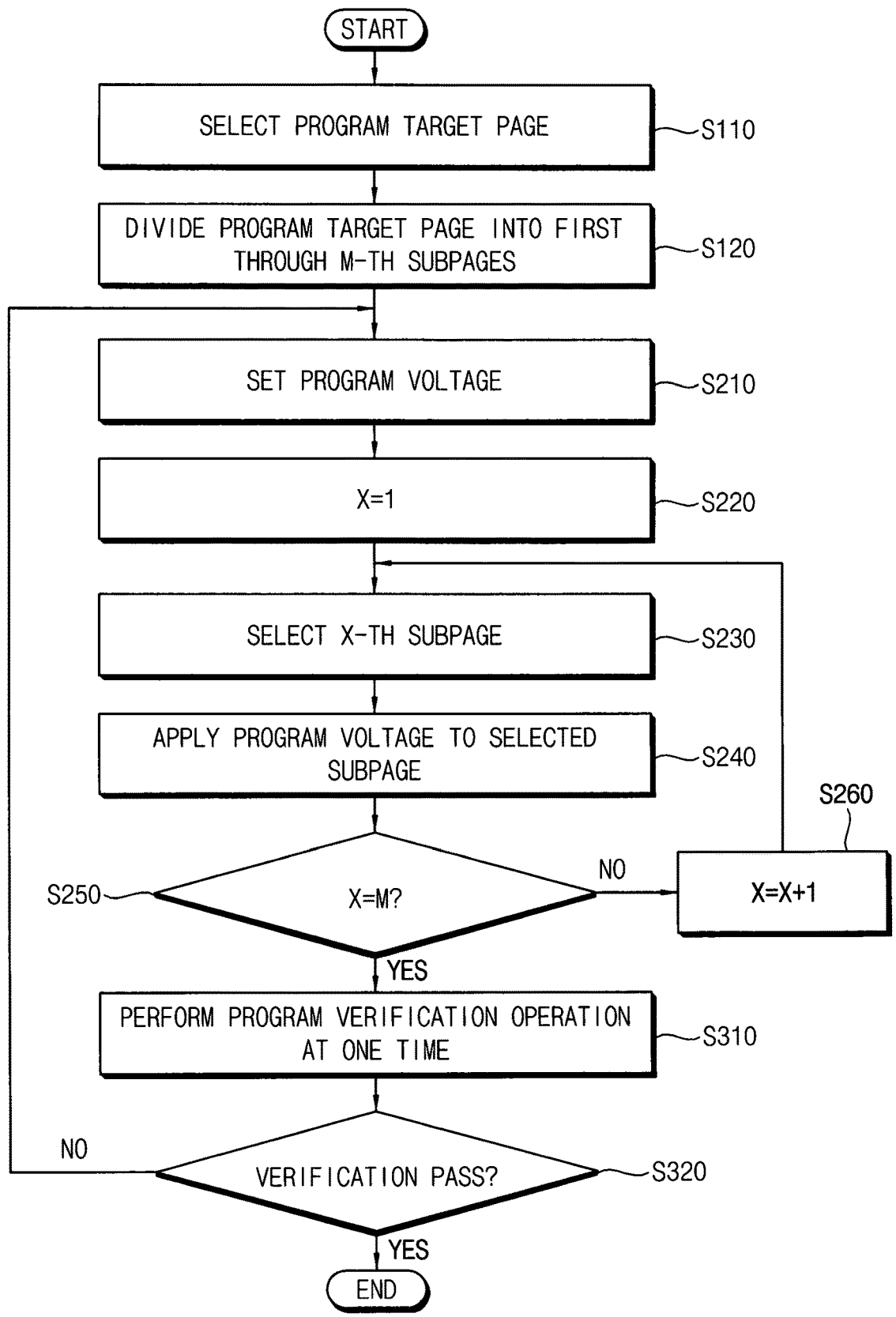
FIG. 7 is a flow chart illustrating an example of the method of writing data of FIG. 1.
Figure 8:
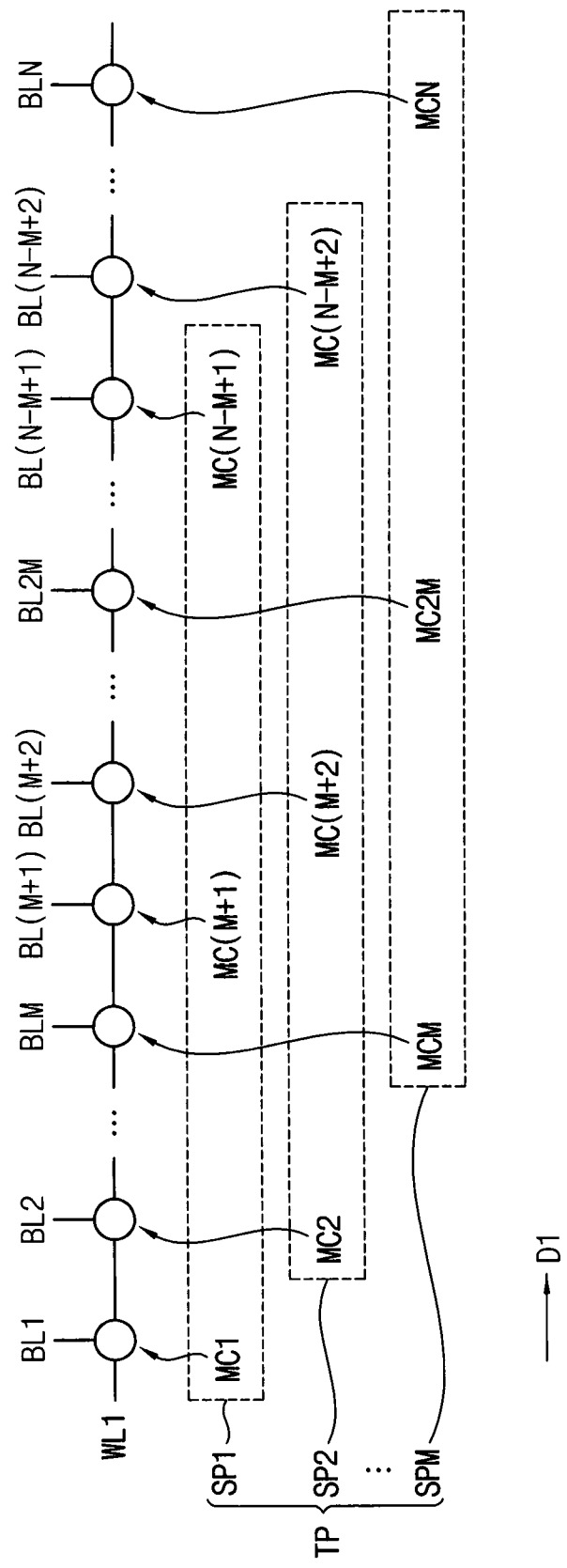
FIG. 8 is a diagram for describing the method of writing data of FIG. 7.

FIG. 7 is a flow chart illustrating an example of the method of writing data of FIG. 1. FIG. 8 is a diagram for describing the method of writing data of FIG. 7.

Referring to FIGS. 1, 2, 7 and 8, when dividing the program target page into the plurality of subpages (step S100, FIG. 1), a program target page TP may be selected (step S110, FIG. 7). For example, the program target page TP connected to a first wordline WL1 among the plurality of wordlines WL may be selected based on the command CMD and the address ADDR received from the memory controller (e.g., the memory controller 600 in FIG. 12).

The program target page TP may be divided into first through M-th subpages SP1, SP2, . . . , SPM (step S120), where M is a natural number greater than or equal to two. In some example embodiments, the dividing scheme in step S120 may be predetermined in a phase of designing the nonvolatile memory device and may be internally stored in the nonvolatile memory device while the nonvolatile memory device is manufactured. In other example embodiments, the dividing scheme in step S120 may be determined based on the command CMD and the address ADDR received from the memory controller. The method for dividing and selecting subpages may be performed according to one or more known techniques.

Each of the first through M-th subpages SP1, SP2, . . . , SPM may include two or more memory cells that are not physically adjacent to one another (e.g., that are physically spaced apart from one another).

For example, the program target page TP may be connected to first through N-th bitlines BL1, BL2, . . . , BLM, BL(M+1), BL(M+2), . . . , BL2M, . . . , BL(N−M+1), BL(N−M+2), . . . , BLN, where N is a natural number greater than or equal to two. The program target page TP may include first through N-th memory cells MC1, MC2, . . . , MCM, MC(M+1), MC(M+2), . . . , MC2M, . . . , MC(N−M+1), MC(N−M+2), . . . , MCN that are connected to the first wordline WL1 and are disposed along the first direction D1. Each of the first through N-th memory cells MC1, MC2, . . . , MCM, MC(M+1), MC(M+2), . . . , MC2M, . . . , MC(N−M+1), MC(N−M+2), . . . , MCN may be connected to a respective one of the first through N-th bitlines BL1, BL2, . . . , BLM, BL(M+1), BL(M+2), . . . , BL2M, . . . , BL(N−M+1), BL(N−M+2), . . . , BLN.

The memory cells MC1, MC(M+1), MC(N−M+1) included in the first subpage SP1 may be connected to K*(M+1)-th bitlines BL1, BL(M+1), . . . , BL(N−M+1) among the first through N-th bitlines, where K is a natural number greater than or equal to zero and less than N/M. Similarly, the memory cells MC2, MC(M+2), . . . , MC(N−M+2) included in the second subpage SP2 may be connected to K*(M+2)-th bitlines BL2, BL(M+2), . . . , BL(N−M+2) among the first through N-th bitlines, and the memory cells MCM, MC2M, . . . , MCN included in the M-th subpage SPM may be connected to K*(M+M)-th bitlines BLM, BL2M, . . . , BLN among the first through N-th bitlines. For example, when K is equal to 4, the memory cells MC1, MC(M+1), MC(N−M+1) included in the first subpage SP1 may be connected to 4*(M+1)-th bitlines BL1, BL(M+1), . . . , BL(N−M+1), the memory cells MC2, MC(M+2), MC(N−M+2) included in the second subpage SP2 may be connected to 4*(M+2)-th bitlines BL2, BL(M+2), BL(N−M+2), and the memory cells MCM, MC2M, MCN included in the M-th subpage SPM may be connected to 4*(M+M)-th bitlines BLM, BL2M, . . . , BLN. As described above, since memory cells included in the same subpage are not directly adjacent to one another and are physically spaced apart from one another along the first direction D1, heat concentration by Joule heating may be prevented during the program operation.

In some example embodiments, a configuration of the subpages SP1, SP2, . . . , SPM may be changed variously while still satisfying the condition in which the memory cells included in the same subpage are not physically adjacent to one another along the first direction D1. For example, the subpages may be formed such that the first through M-th memory cells MC1, MC2, MCM connected to the first through M-th bitlines BL1, BL2, BLM are included in different subpages.

In some example embodiments, the number (e.g., M) of the subpages SP1, SP2, SPM may be determined based on a peak limit current of the nonvolatile memory device. For example, the number of the subpages SP1, SP2, . . . , SPM may be determined such that the amount of current consumption in each subpage is less than the peak limit current of the nonvolatile memory device. For example, the number of the subpages SP1, SP2, . . . , SPM may be greater than or equal to 100 and may be less than or equal to 1000. If the number of the subpages SP1, SP2, . . . , SPM is less than 100, the amount of current consumption in each subpage may exceed the peak limit current of the nonvolatile memory device. If the number of the subpages SP1, SP2, . . . , SPM is greater than 1000, an operation speed (e.g., a program speed) of the nonvolatile memory device may be reduced.

When sequentially performing the program operation on the plurality of subpages (step S200, FIG. 1), a program voltage may be set (step S210, FIG. 7). For example, the program voltage may represent a voltage applied to the bitlines BL1~BLN and may be set to an initial program level.

The first through M-th subpages SP1, SP2, . . . , SPM may be sequentially selected, and the set program voltage may be sequentially applied to the first through M-th subpages SP1, SP2, . . . , SPM. For example, X is set to "1" in an initial operation time (step S220). The first subpage SP1 (e.g., the X-th subpage) may be selected (step S230), the program voltage may be applied to the bitlines BL1, BL(M+1), . . . , BL(N−M+1) connected to the selected first subpage SP1 (step S240), and thus the program operation for the first subpage SP1 may be performed. As described with reference to FIGS. 5A-5B and 6, the off voltage VOFF may be applied to the first wordline WL1.

Such operations may be repeated until all of the first through M-th subpages SP1, SP2, ..., SPM are programmed (e.g., until the program operation for all of the first through M-th subpages SP1, SP2, ..., SPM are completed). For example, step S230 (selecting the subpage) and step S240 (applying the program voltage) may be repeated until steps S230 and S240 are performed for all of the first through M-th subpages SP1, SP2, ..., SPM.

After each repetition of steps 230 and 240, the variable X may be checked to determine if it is equal to M (step S250). For example, when it is determined that X is not equal to M (step S250: NO), e.g., when it is determined that X is less than M, X may increase by one (step S260), and steps S230, S240 and S250 may be repeated. For example, when X=2, the program operation for the second subpage SP2 may be performed, when X=3, the program operation for the third subpage SP3 may be performed, and so on. When it is determined that X is equal to M (step S250: YES), it may represent that the program operations for all of the first through M-th subpages SP1, SP2, ..., SPM are completed, and thus the program verification operation after the program operation may be prepared.

When performing the program verification operation on one program target page at a time (step S300, FIG. 1), a program verification voltage may be applied to all of the bitlines BL1~BLN connected to the program target page TP, and thus the program verification operation for the entire program target page TP may be performed at one time (step S310, FIG. 7). Since the program verification operation is performed simultaneously for an entire program target page TP, the verification may be efficiently performed in consideration of heat crosstalk and/or disturbance.

A result of the program verification operation may be checked (step S320). When it is determined, based on the result of the program verification operation, that all of the memory cells and/or subpages of the program target page TP correspond to a normal program state, e.g., when it is determined that the verification is passed (step S320: YES), the method of writing data according to example embodiments may be successfully completed.

When it is determined, based on the result of the program verification operation, that at least a part of the program target page TP corresponds to a failed program state, e.g., when it is determined that the verification is failed (step S320: NO), the program voltage may be reset, and the program operation may be sequentially re-performed on the plurality of subpages based on the reset program voltage. For example, step S210 of setting the program voltage, steps S220 through S260 of sequentially applying the program voltage, and steps S310 and S320 of performing the program verification operation may be repeated until the method of writing data is successfully completed.

In some example embodiments, the program operation may be performed based on an incremental step pulse program (ISPP) scheme. In the ISPP scheme, the program operation may be performed by sequentially increasing the program voltage. In the nonvolatile memory device including multi-level memory cells (MLC) in which two or more bits are stored in each memory cell, an operation speed, accuracy and reliability of the program operation may be improved or enhanced based on the ISPP scheme. In some example embodiments, at least one of a wordline voltage, a string selection line voltage, and the program verification voltage may be changed, with or instead of increasing the program voltage.

For example, when step S210 is performed for the second time (e.g., if verification fails a first time (step S320: NO)), the program voltage may be reset by increasing the initial program level by $\Delta VP$, and steps S220 through S320 may be re-performed based on the reset program voltage. When step S210 is performed for the third time (e.g., if verification fails a second time (step S320: NO)), the program voltage may be reset by increasing the initial program level by $2*\Delta VP$, and steps S220 through S320 may be re-performed based on the reset program voltage. However, the program voltage may not indefinitely increase, and thus an upper limit level of the program voltage may be predetermined.

Although not illustrated in FIG. 8, the program target page TP may further include memory cells that are disposed along the second direction D2. Memory cells included in the same subpage may not be directly adjacent to one another and may be physically spaced apart from one another along both the first and second directions D1 and D2. For example, as described with reference to FIG. 6, memory cells disposed along the second direction D2 may be connected to the same bitline and different string selection lines, and a target memory cell to which the program voltage is applied may be selected by controlling voltages applied to the string selection lines.

In the method of writing data in the nonvolatile memory device according to example embodiments, the nonvolatile memory device may include the plurality of cell strings, each of which includes the resistive film and the channel layer for forming relatively high cell density. The program target page TP may be divided into the plurality of subpages SP1~SPM, the program operation may be sequentially performed by units of a subpage (e.g., the program operation may be performed in parallel), the program verification operation may be performed at the same time by units of a page, and thus the peak limit current of the nonvolatile memory device may be averaged or distributed. Accordingly, the data writing operation may be rapidly and efficiently performed in the nonvolatile memory device having highly integrated structure.

FIG. 9 is a flow chart illustrating a method of erasing data in a nonvolatile memory device according to example embodiments.

Referring to FIG. 9, a method of erasing data according to example embodiments is performed by a nonvolatile memory device including a plurality of cell strings, and each of the plurality of cell strings includes a plurality of memory cells disposed in a vertical direction. For example, each cell string includes a plurality of memory cells that are stacked in a direction intersecting (e.g., substantially perpendicular to) a substrate. Configurations of the nonvolatile memory device may be substantially the same as configurations described with reference to FIGS. 2 through 6.

In the method of erasing data in the nonvolatile memory device according to example embodiments, an erase target block is divided into a plurality of subblocks (step S1100). A plurality of memory cells included in the nonvolatile memory device may be connected to a plurality of wordlines, memory cells connected to one wordline may form a single page, and at least one page may form a single block. In the nonvolatile memory device according to example embodiments, a data erase operation or a data erasure operation may be performed by units of a subblock.

The erase target block may be one of a plurality of blocks that are connected to the plurality of wordlines, and may be connected to at least one of the plurality of wordlines. In some embodiments, the erase target block may be comprised of one or more pages. Each of the plurality of subblocks may include two or more memory cells that are not physically adjacent to one another (e.g., that are physically spaced apart from one another). The subblock may be referred to as an erase target memory cell group or chunk. Configurations of the erase target block and the plurality of subblocks will be described in detail with reference to FIG. 11.

An erase operation is sequentially performed on the plurality of subblocks one-by-one (step S1200). For example, the erase operation may be performed by units of a subblock.

An erase verification operation is performed at the same time on the entire erase target block, including the plurality of subblocks (step S1300). For example, the erase verification operation may be performed by units of a block.

Figure 10:
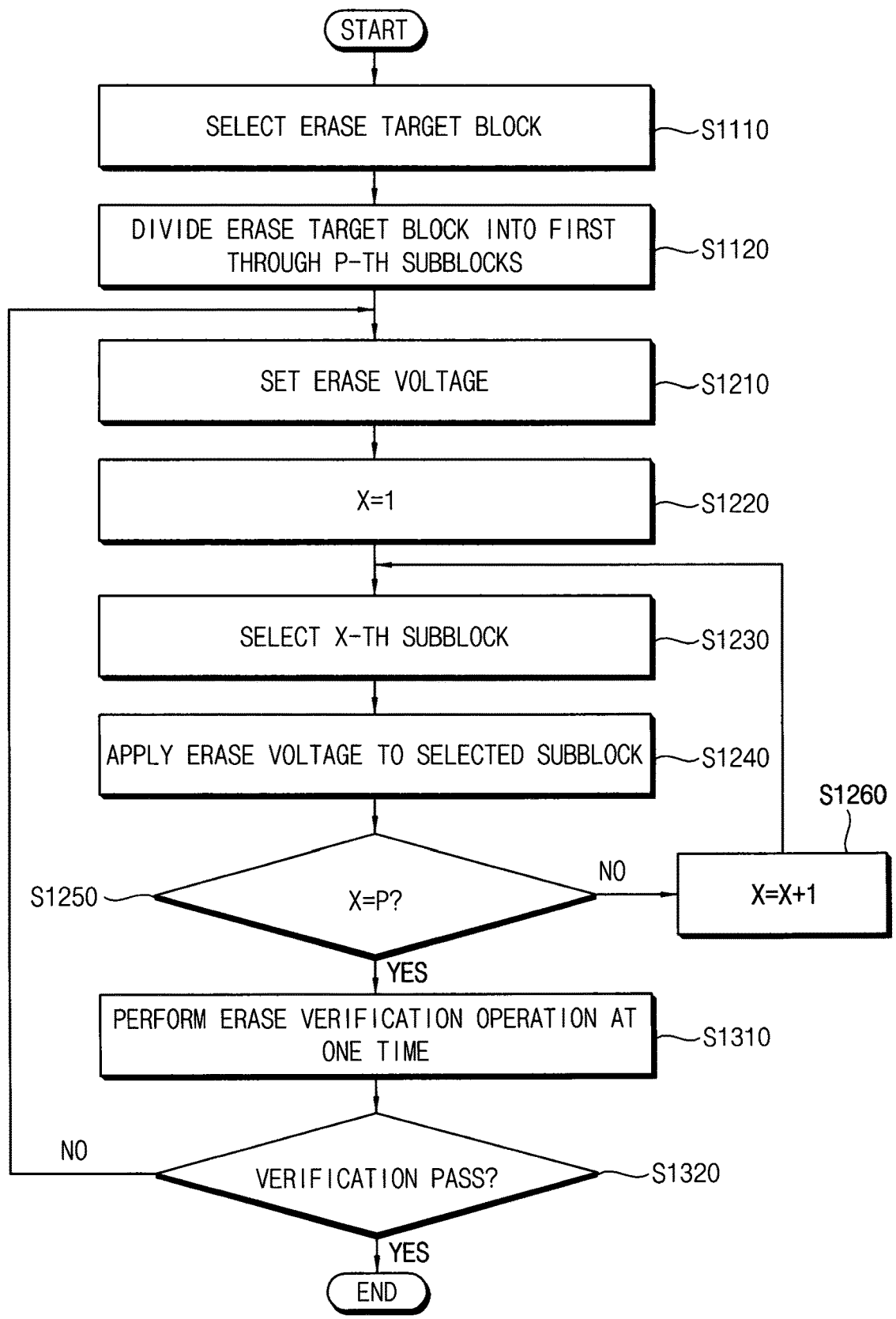
FIG. 10 is a flow chart illustrating an example of the method of erasing data of FIG. 9.
Figure 11:
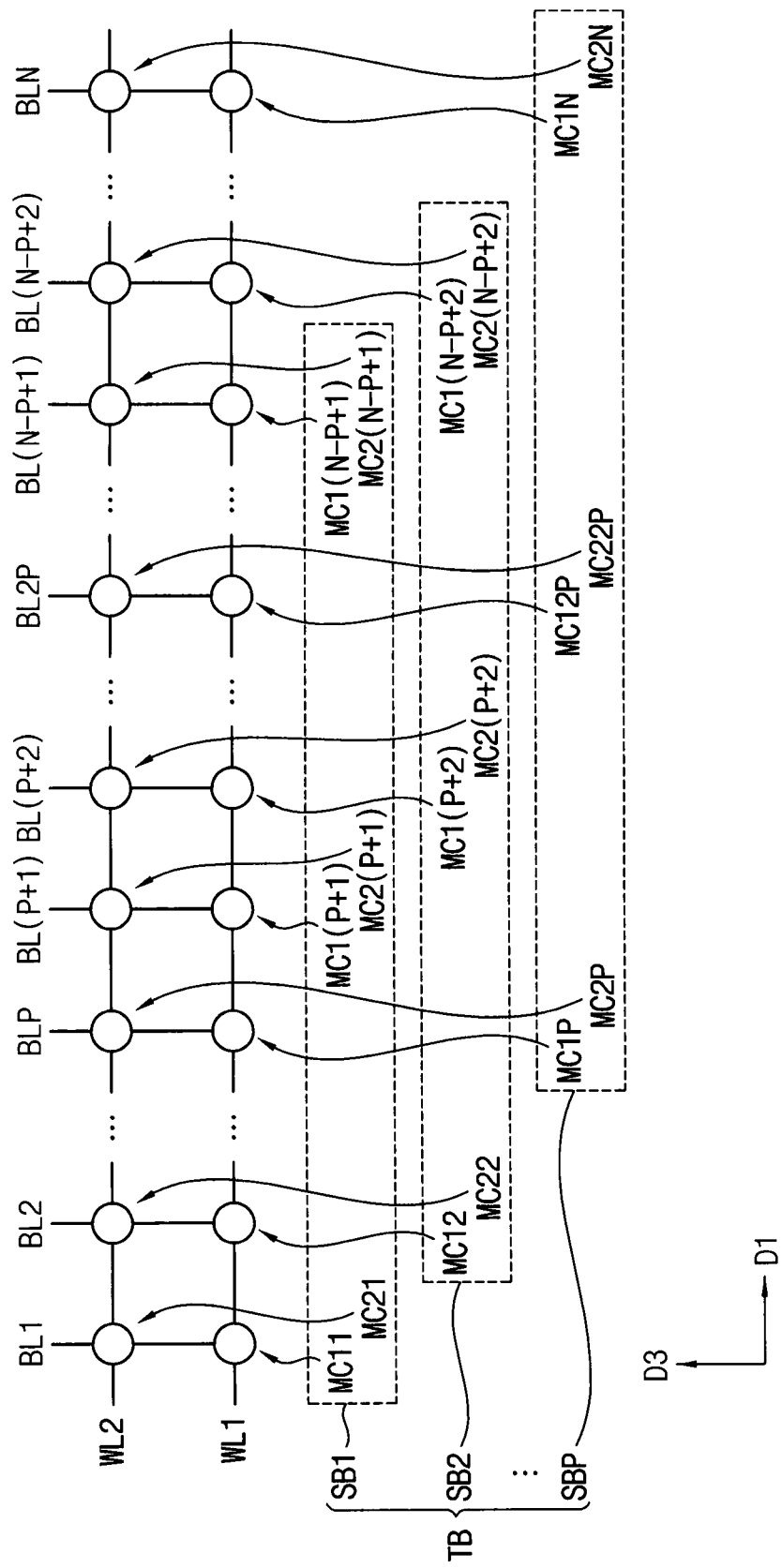
FIG. 11 is a diagram for describing the method of erasing data of FIG. 10.

FIG. 10 is a flow chart illustrating an example of the method of erasing data of FIG. 9. FIG. 11 is a diagram for describing the method of erasing data of FIG. 10.

Referring to FIGS. 2, 9, 10 and 11, when dividing the erase target block into the plurality of subblocks (step S1100, FIG. 9), an erase target block TB may be selected (step S1110, FIG. 10). For example, the erase target block TB connected to first and second wordlines WL1 and WL2 among the plurality of wordlines WL may be selected based on the command CMD and the address ADDR received from the memory controller (e.g., the memory controller 600 in FIG. 12).

FIG. 11 illustrates an example where one block is connected two wordlines WL1 and WL2, however, the inventive concepts are not limited to these illustrated embodiments. For example, one block may be connected to three or more wordlines, or may be connected to one wordline (e.g., as with one page).

The erase target block TB may be divided into first through P-th subblocks SB1, SB2, . . . , SBP (step S1120), where P is a natural number greater than or equal to two. According to example embodiments, the dividing scheme in step S1120 may be predetermined in a phase of designing the nonvolatile memory device or may be determined based on the command CMD and the address ADDR received from the memory controller.

Each of the first through P-th subblocks SB1, SB2, . . . , SBP may include two or more memory cells that are not physically adjacent to one another (e.g., that are physically spaced apart from one another). The sentence "memory cells in the same subblock are not physically adjacent to one another" may reflect that the memory cells are not adjacent to one another in a plan view or on the same plane (e.g., along the first direction D1 and/or the second direction D2). Memory cells in the same subblock may be adjacent to one another along the vertical direction (e.g., the third direction D3).

For example, the erase target block TB may be connected to first through N-th bitlines BL1, BL2, . . . , BLP, BL(P+1), BL(P+2), . . . , BL2P, BL(N−P+1), BL(N−P+2), . . . , BLN. The erase target block TB may include first through N-th memory cells MC11, MC12, . . . , MC1P, MC1(P+1), MC1(P+2), . . . , MC12P, . . . , MC1(N−P+1), MC1 (N−P+2), . . . , MC1N that are connected to the first wordline WL1 and are disposed along the first direction D1, and (N+1)-th through 2N-th memory cells MC21, MC22, . . . , MC2P, MC2(P+1), MC2(P+2), . . . , MC22P, . . . , MC2 (N−P+1), MC2(N−P+2), . . . , MC2N that are connected to the second wordline WL2 and are disposed along the first direction D1. Each of the first through N-th memory cells MC11, MC12, . . . , MC1P, MC1(P+1), MC1(P+2), . . . , MC12P, . . . , MC1(N−P+1), MC1(N−P+2), . . . , MC1N may be connected to a respective one of the first through N-th bitlines BL1, BL2, . . . , BLP, BL(P+1), BL(P+2), . . . , BL2P, . . . , BL(N−P+1), BL(N−P+2), . . . , BLN. Each of the (N+1)-th through 2N-th memory cells MC21, MC22, . . . , MC2P, MC2(P+1), MC2(P+2), . . . , MC22P, . . . , MC2(N−P+1), MC2(N−P+2), . . . , MC2N may be connected to a respective one of the first through N-th bitlines BL1, BL2, . . . , BLP, BL(P+1), BL(P+2), . . . , BL2P, BL(N−P+1), BL(N−P+2), . . . , BLN.

The memory cells MC11, MC1(P+1), MC1(N−P+1), MC21, MC2(P+1), . . . , MC2(N−P+1) included in the first subblock SB1 may be connected to L*(P+1)-th bitlines BL1, BL(P+1), . . . , BL(N−P+1) among the first through N-th bitlines, where L is a natural number greater than or equal to zero and less than N/P. Similarly, the memory cells MC12, MC1(P+2), . . . , MC1(N−P+2), MC22, MC2(P+2), . . . , MC2(N−P+2) included in the second subblock SB2 may be connected to L*(P+2)-th bitlines BL2, BL(P+2), . . . , BL(N−P+2) among the first through N-th bitlines, and the memory cells MC1P, MC12P, MC1N, MC2P, MC22P, . . . , MC2N included in the P-th subblock SBP may be connected to L*(P+P)-th bitlines BLP, BL2P, BLN among the first through N-th bitlines. For example, when L is equal to 6, the memory cells MC11, MC1(P+1), MC1(N−P+1), . . . , MC21, MC2(P+1), . . . , MC2(N−P+1) included in the first subblock SB1 may be connected to 6*(P+1)-th bitlines BL1, BL(P+1), . . . , BL(N−P+1), the memory cells MC12, MC1(P+2), . . . , MC1(N−P+2), MC22, MC2(P+2), . . . , MC2(N−P+2) included in the second subblock SB2 may be connected to 6*(P+2)-th bitlines BL2, BL(P+2), . . . , BL(N−P+2), and the memory cells MC1P, MC12P, MC1N, MC2P, MC22P, . . . , MC2N included in the P-th subblock SBP may be connected to 6*(P+P)-th bitlines BLP, BL2P, . . . , BLN.

In some example embodiments, a configuration of the subblocks SB1, SB2, SBP may be changed variously while satisfying the condition in which the memory cells included in the same subblock are not physically adjacent to one another along the first direction D1.

In some example embodiments, the number (e.g., P) of the subblocks SB1, SB2, . . . , SBP may be determined based on a peak limit current of the nonvolatile memory device. For example, the number of the subblocks SB1, SB2, . . . , SBP may be determined such that the amount of current consumption in each subblock is less than the peak limit current of the nonvolatile memory device.

According to example embodiments, the number of the subpages SP1, SP2, . . . , SPM described with reference to FIGS. 7 and 8 and the number of the subblocks SB1, SB2, . . . , SBP described with reference to FIGS. 9 and 10 may be equal to each other (e.g., M=P), may be different from each other (e.g., M*P), and may be changed variously with satisfying the condition associated with the peak limit current.

When sequentially performing the erase operation on the plurality of subblocks (step S1200, FIG. 9), an erase voltage may be set (step S1210, FIG. 10). For example, the erase voltage may represent a voltage applied to the bitlines BL1~BLN and may be set to an initial erase level.

The first through P-th subblocks SB1, SB2, . . . , SBP may be sequentially selected, and the set erase voltage may be sequentially applied to the first through P-th subblocks SB1, SB2, . . . , SBP. For example, X is one in an initial operation time (step S1220). The first subblock SB1 may be selected (step S1230), the erase voltage may be applied to the bitlines BL1, BL(P+1), ..., BL(N–P+1) connected to the selected first subblock SB1 (step S1240), and thus the erase operation for the first subblock SB1 may be performed.

Such operations may be repeated until all of the first through P-th subblocks SB1, SB2, ..., SBP are erased (e.g., until the erase operation for all of the first through P-th subblocks SB1, SB2, ..., SBP are completed). In other words, step S1230 of selecting the subblock and step S1240 of applying the erase voltage may be repeated until steps S1230 and S1240 are performed for all of the first through P-th subblocks SB1, SB2, ..., SBP.

For example, when it is determined that X is not equal to P (step S1250: NO), e.g., when it is determined that X is less than P, X may increase by one (step S1260), and steps S1230, s1240 and S1250 may be repeated. For example, the erase operation for the second subblock SB2 may be performed. When it is determined that X is equal to P (step S1250: YES), it may represent that the erase operation for all of the first through P-th subblocks SB1, SB2, ..., SBP are completed, and thus the erase verification operation after the erase operation may be prepared.

When performing the erase verification operation on the erase target block at the same time (step S1300), an erase verification voltage may be applied to the bitlines BL1~BLN connected to the erase target block TB, and thus the erase verification operation for the entire erase target block TB may be performed at once (step S1310).

A result of the erase verification operation may be checked (step S1320). When it is determined, based on the result of the erase verification operation, that all of the erase target block TB correspond to a normal erase state, e.g., when it is determined that the verification is passed (step S1320: YES), the method of erasing data according to example embodiments may be successfully completed.

When it is determined, based on the result of the erase verification operation, that at least a part of the erase target block TB corresponds to a failed erase state, e.g., when it is determined that the verification is failed (step S1320: NO), the erase voltage may be reset, and the erase operation may be sequentially re-performed on the plurality of subblocks based on the reset erase voltage. For example, step S1210 (setting the erase voltage), steps S1220 through S1260 (sequentially applying the erase voltage), and steps S1310 and S1320 (performing the erase verification operation) may be repeated until the method of erasing data is successfully completed.

In some example embodiments, the erase operation may be performed based on an incremental step pulse erase (ISPE) scheme. In the ISPE scheme, the erase operation may be performed by sequentially increasing the erase voltage with each repetition of steps of the erase operation (e.g., steps S1210, S1220-S1260, and S1310-1320). The ISPE scheme may be substantially the same as the ISPP scheme described with reference to FIGS. 7 and 8, except that the erase voltage is controlled. In some example embodiments, at least one of a wordline voltage, a string selection line voltage and the erase verification voltage may be changed, with or instead of increasing the erase voltage.

For example, when step S1210 is performed for the second time (e.g., if verification fails for a first time (step S1210: NO)), the erase voltage may be reset by increasing the initial erase level by $\Delta VE$, and steps S1220 through S1320 may be re-performed based on the reset erase voltage. When step S1210 is performed for the third time (if verification fails for a second time (step S1210: NO)), the erase voltage may be reset by increasing the initial erase level by 2*AVE, and steps S1220 through S1320 may be re-performed based on the reset erase voltage.

Although not illustrated in FIG. 11, the erase target block TB may further include memory cells that are disposed along the second direction D2. Memory cells included in the same subblock may not be directly adjacent to one another and may be physically spaced apart from one another along both the first and second directions D1 and D2. For example, as described with reference to FIG. 6, memory cells disposed along the second direction D2 may be connected to the same bitline and different string selection lines, and a target memory cell to which the erase voltage is applied may be selected by controlling voltages applied to the string selection lines.

In the method of erasing data in the nonvolatile memory device according to example embodiments, the nonvolatile memory device may include the plurality of cell strings, each of which includes the resistive film and the channel layer for forming relatively high cell density. The erase target block TB may be divided into the plurality of subblocks SB1~SBP, the erase operation may be sequentially performed by units of a subblock (e.g., the erase operation may be performed in parallel), the erase verification operation may be performed at one time by units of a block, and thus the peak limit current of the nonvolatile memory device may be averaged or distributed. Accordingly, the data erase operation may be rapidly and efficiently performed in the nonvolatile memory device having highly integrated structure.

As will be appreciated by those skilled in the art, the present disclosure may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device. For example, the computer readable medium may be a non-transitory computer readable medium.

Figure 12:
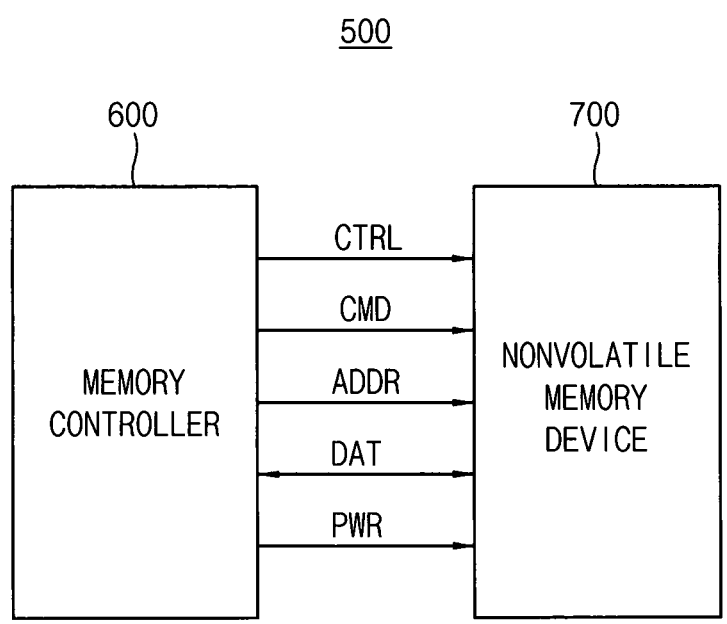
FIG. 12 is a block diagram illustrating a memory system according to example embodiments.

FIG. 12 is a block diagram illustrating a memory system according to example embodiments.

Referring to FIG. 12, a memory system 500 includes a memory controller 600 and at least one nonvolatile memory device 700.

The nonvolatile memory device 700 may correspond to the nonvolatile memory device according to example embodiments, such as those disclosed herein, and may perform data erase, program (or write), and/or read operations under control of the memory controller 600. In particular, the nonvolatile memory device 700 may perform the method of writing data according to example embodiments (e.g., the method of FIGS. 1 and 7) and/or the method of erasing data according to example embodiments (e.g., the method of FIGS. 9 and 10). The nonvolatile memory device 700 may receive a command CMD and an address ADDR through I/O lines from the memory controller 600 for performing such operations, and may exchange data DAT with the memory controller 600 for performing such program or read operation. In addition, the nonvolatile memory device 700 may receive a control signal CTRL through a control line from the memory controller 600. In addition, the nonvolatile memory device 700 receives a power PWR through a power line from the memory controller 600.

Figure 13:
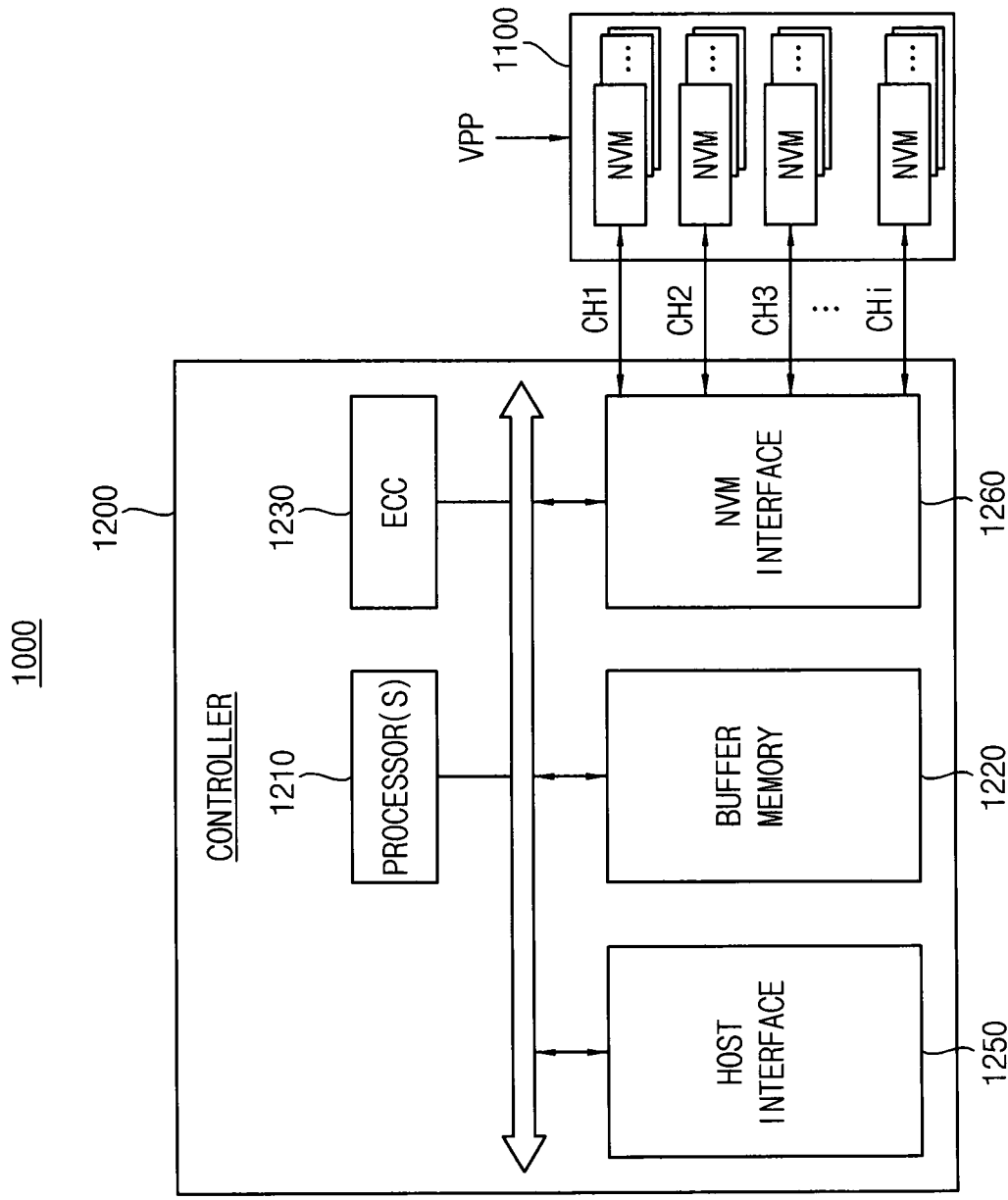
FIG. 13 is a block diagram illustrating a storage device that includes a nonvolatile memory device according to example embodiments.

FIG. 13 is a block diagram illustrating a storage device that includes a nonvolatile memory device according to example embodiments.

Referring to FIG. 13, a storage device 1000 includes a plurality of nonvolatile memory devices 1100 and a controller 1200. For example, the storage device 1000 may be any storage device such as an embedded multimedia card (eMMC), a universal flash storage (UFS), a solid state disc or solid state drive (SSD), etc.

The controller 1200 may be connected to the nonvolatile memory devices 1100 via a plurality of channels CH1, CH2, CH3 . . . CHi. The controller 1200 may include one or more processors 1210, a buffer memory 1220, an error correction code (ECC) circuit 1230, a host interface 1250, and a nonvolatile memory interface 1260.

The buffer memory 1220 may store data used to drive the controller 1200. The ECC circuit 1230 may calculate error correction code values of data to be programmed during a program operation, and may correct an error of read data using an error correction code value during a read operation. In a data recovery operation, the ECC circuit 1230 may correct an error of data recovered from the nonvolatile memory devices 1100. The host interface 1250 may provide an interface with an external device. The nonvolatile memory interface 1260 may provide an interface with the nonvolatile memory devices 1100.

Each of the nonvolatile memory devices 1100 may correspond to the nonvolatile memory device according to example embodiments, such as those disclosed herein, and may be optionally supplied with an external high voltage VPP.

The inventive concepts may be applied to various devices and systems that include a nonvolatile memory device. For example, the inventive concepts may be applied to systems such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of writing data in a nonvolatile memory device including a plurality of cell strings, each of the plurality of cell strings including a plurality of memory cells disposed in a vertical direction, the method comprising:
   dividing a program target page into a plurality of subpages, the program target page being connected to one of a plurality of wordlines, each of the plurality of subpages including memory cells that are physically spaced apart from one another;
   sequentially performing a program operation on the plurality of subpages; and
   performing a program verification operation on the program target page including performing the program verification operation on the plurality of subpages at the same time;
   determining a result of the program operation;
   when it is determined, based on the result of the program verification operation, that at least a part of the program target page corresponds to a failed program state, resetting the program voltage to a reset program voltage; and
   sequentially re-performing the program operation on the plurality of subpages based on the reset program voltage,
   wherein the sequentially performing the program operation includes;
      setting a program voltage;
      selecting one subpage of the plurality of subpages; and
      applying the program voltage to bitlines connected to the select one subpage.

2. The method of claim 1, wherein the selecting one of the plurality of subpages and the applying the program voltage to the bitlines connected to the selected one subpage are repeated until all of the plurality of subpages are programmed.

3. The method of claim 1, wherein each of the plurality of cell strings includes:
   a string selection transistor connected to a bitline and a string selection line;
   the plurality of memory cells disposed in the vertical direction between the string selection transistor and a common source line, the plurality of memory cells being connected to the plurality of wordlines, respectively; and
   a channel structure penetrating the string selection line and the plurality of wordlines that are stacked in the vertical direction, the channel structure including a resistive film, a channel layer surrounding the resistive film, and an insulation film surrounding the channel layer.

4. The method of claim 1, wherein:
   the program target page is connected to first through N-th bitlines where N is a natural number greater than or equal to two,
   the plurality of subpages include first through M-th subpages where M is a natural number greater than or equal to two, and
   memory cells included in the first subpage are connected to K*(M+1)-th bitlines among the first through N-th bitlines, respectively, where K is a natural number greater than or equal to zero and less than N/M.

5. The method of claim 1, wherein a number of the plurality of subpages is determined based on a peak limit current of the nonvolatile memory device.

6. A nonvolatile memory device comprising:
   a memory cell array including a plurality of cell strings formed in a vertical direction,
   wherein each of the plurality of cell strings includes:
   a string selection transistor connected to a bitline and a string selection line;
   a plurality of memory cells disposed in the vertical direction between the string selection transistor and a common source line, the plurality of memory cells being connected to a plurality of wordlines, respectively; and a channel structure penetrating the string selection line and the plurality of wordlines that are stacked in the vertical direction, the channel structure including a resistive film, a channel layer surrounding the resistive film, and an insulation film surrounding the channel layer; and a control circuit configured to perform a data writing operation by dividing a program target page into a plurality of subpages, sequentially performing a program operation on the plurality of subpages, and performing a program verification operation on the program target page including the plurality of subpages at the same time, wherein the program target page is connected to one of the plurality of wordlines, and each of the plurality of subpages includes memory cells that are physically spaced apart from one another, wherein the control circuit is configured to further perform a data erasing operation by dividing an erase target block into a plurality of subblocks, sequentially performing an erase operation on the plurality of subblocks, and performing an erase verification operation on the erase target block including the plurality of subblocks at the same time, wherein the erase target block is connected to at least one of the plurality of wordlines, and wherein a number of the plurality of subpages is different from a number of the plurality of subblocks.

7. A nonvolatile memory device comprising:

a memory cell array including a plurality of cell strings formed in a vertical direction, wherein each of the plurality of cell strings includes;

a string selection transistor connected to a bitline and a string selection line;

a plurality of memory cells disposed in the vertical direction between the string selection transistor and a common source line, the plurality of memory cells being connected to a plurality of wordlines, respectively; and a channel structure penetrating the string selection line and the plurality of wordlines that are stacked in the vertical direction, the channel structure including a resistive film, a channel layer surrounding the resistive film, and an insulation film surrounding the channel layer; and a control circuit configured to perform a data writing operation by dividing a program target page into a plurality of subpages, sequentially performing a program operation on the plurality of subpages, and performing a program verification operation on the program target page including the plurality of subpages at the same time, wherein the program target page is connected to one of the plurality of wordlines, and each of the plurality of subpages includes memory cells that are physically spaced apart from one another, wherein the control circuit is configured to further perform a data erasing operation by dividing an erase target block into a plurality of subblocks, sequentially performing an erase operation on the plurality of subblocks, and performing an erase verification operation on the erase target block including the plurality of subblocks at the same time, wherein the erase target block is connected to at least one of the plurality of wordlines, and wherein a number of the plurality of subpages and a number of the plurality of subblocks are determined based on a peak limit current of the nonvolatile memory device.

* * * * *